United States Patent [19]
Akin et al.

[11] Patent Number: 5,151,777
[45] Date of Patent: Sep. 29, 1992

[54] INTERFACE DEVICE FOR THERMALLY COUPLING AN INTEGRATED CIRCUIT TO A HEAT SINK

[75] Inventors: Timur Akin, Toledo, Ohio; Bruce A. Myers, Kokomo, Ind.; William M. Maki, Fort Wayne, Ind.; Ponnusamy Palanisamy, Kokomo, Ind.

[73] Assignee: Delco Electronics Corporation, Kokomo, Ind.

[21] Appl. No.: 422,395

[22] Filed: Oct. 16, 1989

Related U.S. Application Data

[63] Continuation-in-part of Ser. No. 318,389, Mar. 3, 1989, abandoned.

[51] Int. Cl.$^5$ .................. H01L 39/02; H01L 23/02; H01L 25/04
[52] U.S. Cl. .................................. 357/81; 357/80; 357/82
[58] Field of Search ........................... 357/81, 82, 80

[56] References Cited

U.S. PATENT DOCUMENTS

| | | | |
|---|---|---|---|
| 3,399,332 | 8/1968 | Savolainen | 317/234 |
| 3,846,824 | 11/1974 | Bell | 357/80 |
| 3,969,754 | 7/1976 | Kaniya et al. | 357/65 |
| 4,196,442 | 4/1980 | Kaniya et al. | 357/67 |
| 4,283,464 | 8/1981 | Hascoe | 428/594 |
| 4,320,412 | 3/1982 | Hynes et al. | 357/70 |
| 4,401,798 | 8/1983 | Larker | 357/81 |
| 4,427,993 | 1/1984 | Fichot et al. | 357/81 |
| 4,450,471 | 5/1984 | Wellhoefer et al. | 357/80 |
| 4,482,912 | 11/1984 | Chiba et al. | 357/67 |
| 4,521,801 | 6/1985 | Kato et al. | 357/71 |
| 4,554,575 | 11/1985 | Lucas | 357/80 |
| 4,811,166 | 3/1989 | Alvarez et al. | 361/386 |

FOREIGN PATENT DOCUMENTS

| | | | |
|---|---|---|---|
| 0036915 | 3/1980 | Japan | 357/81 A |
| 0128852 | 10/1980 | Japan | 357/81 A |
| 0015241 | 1/1985 | Japan | 357/81 |

Primary Examiner—Andrew J. James
Assistant Examiner—Carl Whitehead, Jr.
Attorney, Agent, or Firm—Cary W. Brooks

[57] ABSTRACT

An interface device for thermally coupling an integrated circuit to a heat sink having a first material characterized by high thermal conductivity such as copper, where the copper completely surrounds a plurality of inner core regions. The plurality of inner core regions contain a low coefficient of thermal expansion material and are primarily disposed in the copper material in the region directly under the integrated circuit. The low expansion regions retard thermal expansion of the interface device during exposure to variations in the temperature, yet there are continuous paths of copper provided between the integrated circuit and heat sink to promote efficient heat transfer between the silicon chip to the heat sink through the high conductivity copper. In addition, high thermal resistance layers are provided for dielectric isolation between an integrated circuit chip and heat sink, when necessary, using this invention. This interface device is characterized by enhanced thermal dissipation yet provides a compatible coefficient of thermal expansion with the silicon integrated circuit and underlying heat sink.

6 Claims, 2 Drawing Sheets

INTERFACE DEVICE FOR THERMALLY COUPLING AN INTEGRATED CIRCUIT TO A HEAT SINK

This patent application is a continuation-in-part patent application of United States patent application Ser. No. 318,389 filed Mar. 3, 1989, now abandoned.

This invention relates to an interface device used to transfer heat away from a mounted electronic component. In particular, this invention relates to an interface device for transferring heat generated by a high power silicon integrated circuit chip to a heat sink characterized by a high coefficient of thermal conductivity.

BACKGROUND OF THE INVENTION

The environmental conditions which integrated circuits must endure during operation are severe, particularly in an automotive environment. During the operation of an automobile, the integrated circuit chips are exposed to large variations in temperature arising from not only the changes in ambient atmospheric temperature, but also from the variations in the operating temperature generated by the automobile itself. Generally, an automobile manufacturer requires these integrated circuits to reliably perform while experiencing repeated cycling between ambient temperatures of $-40°$ C. and $+125°$ C. Therefore, it is necessary that the integrated circuit be capable of withstanding these temperature extremes without detriment to its structural or electrical integrity.

In addition, power generating integrated circuits are particularly problematic in that they accordingly also, generate substantial amounts of heat during generation of the power. This heat generation increases the temperature of the chip and may detrimentally affect circuit performance and/or cause chip failure. In addition, the power generating integrated circuit may need to be dielectrically isolated from the surrounding components. These detrimental effects are compounded when combined with the temperature extremes experienced by the integrated circuit during operation of an automobile. Therefore, it is desirable to provide means for maintaining a constant temperature of the integrated circuit chip despite any variations in temperature within and surrounding the chip. A common solution involves soldering a chip to a heat sink. Generally the heat sinks are formed from aluminum, which is relatively inexpensive, or alternatively copper, which is relatively expensive.

However, a shortcoming of this approach is that during the exposure to the variations in temperature, the solder used to couple the integrated circuit chip and heat sink will fracture due to stresses arising from the differences in thermal expansion rates of the various materials. The coefficient of thermal expansion for silicon is approximately equal to $3.5 \times 10^{-6}/°$ C., while the coefficients of thermal expansion for copper and aluminum are approximately equal to $17.7 \times 10^{-6}/°$ C. and $24 \times 10^{-6}/°$ C., respectively. Generally, the solder will fracture most often at the corners of the chip where the stresses are concentrated These fractures are particularly undesirable as they increase the thermal resistance between the chip and the heat sink, which in turn causes the temperature of the chip to rise because of retarded heat transfer to the heat sink. This phenomenon further adversely affects the performance of the integrated circuit thereby promoting failure of the integrated circuit chip Alternative solutions to the temperature problem have also been disclosed by the prior art and generally involve the use of an interface device, or buffer, between the integrated circuit chip and heat sink which is characterized by a high thermal conductivity, or correspondingly, relatively low thermal resistance. In addition, it is desirable that the interface device have a coefficient of thermal expansion which is intermediate between that of the integrated circuit chip and that of the heat sink. In such a structure, the integrated circuit is soldered to one side of the interface device and the heat sink to the other side of the interface device Molybdenum and tungsten have been commonly used for interface devices because of their appropriate heat transfer and expansion characteristics. These interface devices have been a satisfactory solution to the problem, however it is desirable to provide a less expensive alternative In particular, for automotive applications, molybdenum and tungsten are considered too expensive for commercial use.

Another type of interface device has been proposed in United States patent application Ser. No. 191,441, entitled "Integrated Circuit Heat Sink Interface Apparatus" to Akin et al, wherein an inner core of low expansion material is surrounded everywhere by a copper outer layer characterized by high thermal conductivity. The integrated circuit contacts the copper layer at a region which is over the inner core layer of low expansion material. The heat sink contacts the copper layer on an opposite side of the integrated circuit. This arrangement is of relatively low cost and permits rapid conductivity of the generated heat from the integrated circuit through the copper outer layer around the inner core layer, while the low expansion material retards the overall thermal expansion of the interface device. Although this design is satisfactory, it would be desirable to provide an interface device which permits the most efficient heat transfer directly from the integrated circuit to the heat sink, rather than around the inner core layer as in this previous method.

Therefore, it is desirable to provide an interface device which provides direct thermal coupling between an integrated circuit and heat sink, and which is durable, reliable over varying temperature conditions, characterized by an intermediate coefficient of expansion, and readily amenable to automotive production techniques.

SUMMARY OF THE INVENTION

It is, therefore, an object of this invention to provide an efficient interface device suitable for thermally coupling an integrated circuit directly to a heat sink, which is durable such that it can reliably withstand the extreme operating temperatures present in an automotive environment.

It is a further object of this invention to provide an interface device which is characterized by a coefficient of thermal expansion intermediate between the coefficients for the integrated circuit and the heat sink.

In addition, it is an object of this invention that such an interface device be compatible with means for providing dielectric isolation between an appropriate integrated circuit chip and heat sink.

Lastly, it is still a further object of this invention to provide an interface device which is of relatively low cost and readily amenable to automotive production techniques.

In accordance with the preferred embodiment of this invention, these and other objects and advantages are accomplished as follows.

In a preferred embodiment, the interface device for thermally coupling an integrated circuit to a heat sink comprises a first material characterized by high thermal conductivity such as copper, wherein the copper completely surrounds a plurality of inner core regions. The plurality of inner core regions comprise a low coefficient of expansion material, preferably an iron-nickel alloy, such as Invar or Kovar. In addition, the plurality of inner core regions are primarily disposed in the copper material in the region directly under the integrated circuit, thereby retarding expansion of the interface device during exposure to variations in the temperature.

In use, a silicon integrated circuit chip is soldered to an upper surface of the interface device, and an aluminum or copper heat sink is bolted to a lower surface of the interface device Preferably, silicon grease is placed between the lower surface of the interface device and the heat sink so as to promote heat flow through the interface device to the heat sink. Therefore, the heat generated by the integrated circuit chip passes directly into the interface device, and primarily into the high thermally conductive copper layer wherein the heat transfers rapidly through the copper into the heat sink. The low expansion material retards the overall expansion rate of the interface device.

An inventive feature of this device is that the plurality of low expansion regions retard the expansion rate of the device where it is most needed under the silicon chip, but do not hamper the heat flow from the silicon chip to the heat sink. With previous designs, the low expansion material which is typically characterized by high thermal resistivity, acted as a barrier against effective heat transfer out of the chip. The heat was forced to flow around the low expansion material/high resistivity material, resulting in an inefficient method of heat transfer. With this design, the heat is not required to flow around the low expansion material, as there are continuous paths of high conductivity material directly from the integrated circuit chip to the heat sink. This interface device is characterized by enhanced thermal dissipation yet provides a compatible coefficient of thermal expansion with the silicon integrated circuit and underlying heat sink.

The coefficient of thermal expansion of the preferred interface device having a cross-sectional area which is approximately 80 percent copper and approximately 20 percent an iron-nickel alloy characterized by about 42 percent nickel, was found to be approximately $9 \times 10^{-6}/°$ C. This coefficient of thermal expansion is sufficiently compatible with that of silicon to allow the solder joint between the chip and the interface device to remain intact during operation without fracturing for a substantial number of temperature cycles between $-40°$ C. and $+125°$ C.

Other objects and advantages of this invention will be better appreciated from a detailed description thereof, which follows

DETAILED DESCRIPTION

This invention comprehends an interface device which is used to thermally couple an integrated circuit chip to a heat sink. The preferred interface device is thermally efficient in that heat generated from the integrated circuit passes directly through the interface device into the heat sink. In addition, the preferred device is characterized by a coefficient of thermal expansion intermediate between the coefficients for the integrated circuit and the heat sink. The preferred interface device is durable in that it can reliably withstand the extreme operating temperatures present in an automotive environment without detriment to its structural or electrical integrity. In addition, this preferred interface device is conducive in cost and manufacturability to automotive production techniques.

Figure 1:
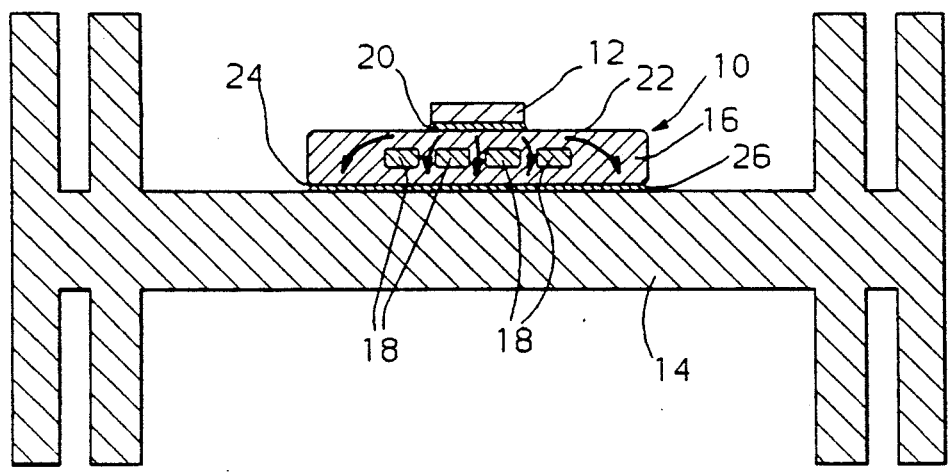
FIG. 1 is cross-sectional view of an interface device which may be used for thermally coupling an integrated circuit chip and heat sink in accordance with a preferred embodiment of this invention.

A preferred embodiment of the interface device 10 is shown in FIG. 1. The interface device 10 is coupled to an integrated circuit 12 and an underlying heat sink 14. The interface device 10 primarily comprises a first material 16 which is characterized by high thermal conductivity or low thermal resistance. A second material 18 which is characterized by a low coefficient of thermal expansion is dispersed throughout the first material 16. This first material 16 completely surrounds each of the plurality regions of second material 18.

The preferred first material 16 which is characterized by a high thermal conductivity is copper, however other materials characterized by high thermal conductivity, such as aluminum, may also be used. In addition, a consideration when choosing the first material 16 is that the first material 16 must be compatible with the second material 18 which will be dispersed throughout the first material 16. For the first material 16, copper is preferred because of its high thermal conductivity, cost and ease of manufacturability.

The plurality of second material 18 regions comprise a material characterized by a low coefficient of thermal expansion, such as an iron-nickel alloy. In particular, an iron-nickel alloy comprising approximately 42 percent nickel and and approximately 58 percent iron such as Invar is preferred. However, other materials which are characterized by a low coefficient of thermal expansion and which are compatible with the surrounding first material 16, may also be used.

As shown in FIG. 1, a silicon integrated circuit chip 12 is soldered, the solder being denoted as layer 20, to an upper surface 22 of the primarily copper interface device 10 and an aluminum or copper heat sink 14 is bolted to a lower surface 24 of the primarily copper interface device 10. The preferred solder is a 25/75 tin-lead type for manufacturability and availability purposes, however other suitable solders may also be used. Preferably, silicon grease (denoted as layer 26) is placed between the lower surface 24 of the interface device 10 and the heat sink 14. The silicon grease 26 is preferred since it permits heat transfer through to the heat sink 14 from the interface device 10, however, other suitable materials which will provide the appropriate heat transfer through to the heat sink 14 from the interface device 10 may also be used, such as suitable epoxies or solder.

Preferably, the plurality of low expansion second material regions 18 are primarily located under the silicon integrated circuit chip 12 in the surrounding copper or other appropriate first material 16. It is desirable to position the plurality of low expansion second material regions 18 primarily under the silicon chip 12 because the silicon expands at a much lower rate as temperature is increased, than the other materials. Therefore, the expansion of the interface device 10 is retarded most where it is required, i.e., under the silicon chip 12, with this design.

In addition, the number of low expansion second material regions 18 may vary within the surrounding copper material 16. As shown in FIG. 1, there are five low expansion regions 18 primarily situated under the integrated circuit chip 12 within the surrounding copper material 16. The arrows indicate the pattern of heat flow from the integrated circuit chip 12 to the heat sink 14 through the interface device 10. With this device 10, heat transfer occurs most efficiently. The heat generated by the integrated circuit chip 12 flows directly into the interface device 10, dissipating through the highly conductive surrounding copper layer 16 wherein the heat transfers rapidly through the copper layer 16 into the heat sink 14.

A truly inventive feature of this device 10 is that the plurality of low expansion regions 18 retard the expansion rate of the device 10 where it is most needed under the silicon chip 12, but do not hamper the heat flow from the silicon chip 12 to the heat sink 14 since the highly conductive surrounding copper layer 16 is provided generally everywhere throughout the device 10. With previous designs, the low expansion material which is typically characterized by high thermal resistivity, acted as a barrier against effective heat transfer out of the chip 12. The heat was forced to go around the low expansion material/high resistivity material, resulting in an inefficient method of heat transfer With this design, the heat does not need to go around the low expansion second material 18, as there are continuous paths of high conductivity copper straight from the integrated circuit chip 12 to the heat sink 14.

Therefore, this interface device 10 is characterized by enhanced and efficient thermal dissipation yet provides a compatible coefficient of thermal expansion with the silicon integrated circuit 12 and underlying heat sink 14.

Figure 2:
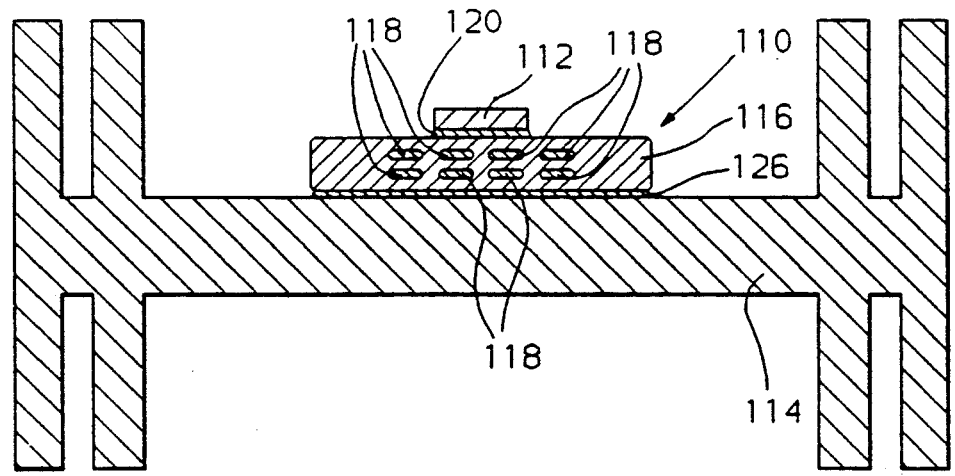
FIG. 2 is a cross-sectional view of an interface device in accordance with an alternative and equally preferred embodiment of this invention.

As shown in FIG. 2, an alternative and equally preferred embodiment 110 of this invention is also illustrated. In this interface device 110, there are essentially two rows of the low expansion second material 118 enveloped by the surrounding copper or other high conductivity material 116. This device 110 permits enhanced heat transfer through the surrounding copper 116 and is characterized by an appropriate expansion rate. Theoretically, a device 110 in accordance with this invention, could have as few as two low expansion regions 116 separated by the copper 118 under the silicon chip 112 thereby providing a single direct path for heat transfer from the silicon chip 112 to the heat sink 114, or a multitude or regions wherein the only limitations would be manufacturing and feasibility considerations.

Figure 3:
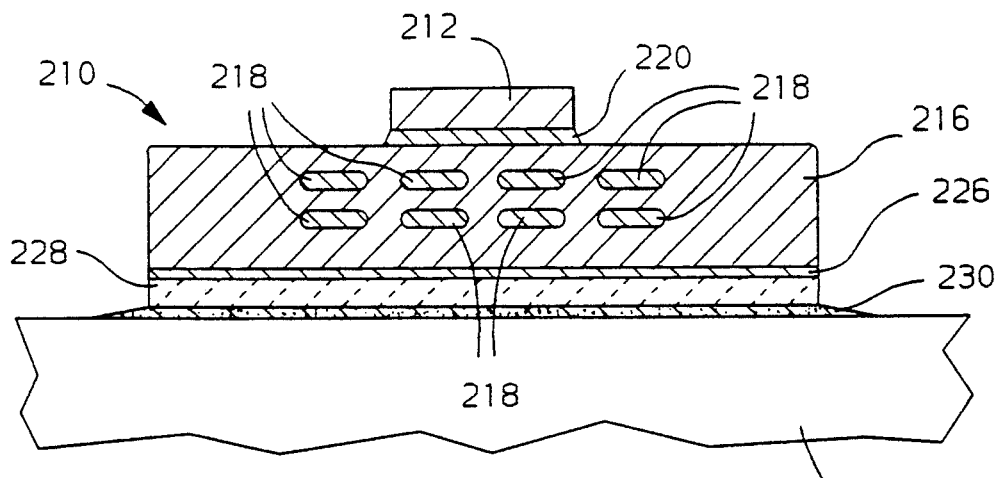
FIG. 3 is a cross sectional view of the interface device shown in FIG. 2 wherein dielectric isolation means is also provided between the interface device and the heat sink.

This interface device 210 shown in FIG. 3 may also be used when dielectric isolation is required, such as between a power producing integrated circuit 212 and a heat sink 214. In this preferred embodiment, the dielectric isolation is provided by a polyimide layer 228, which has a thermally conductive material dispersed throughout for enhanced thermal conductivity characteristics. The polyimide layer 228 is attached to the heat sink 214 by a very thin layer of thermally conductive adhesive 230.

These two relatively high thermal resistance layers, i.e., the polyimide layer 228 and the conductive adhesive layer 230, are manufactured to be very thin to minimize the detrimental effects associated with their inherently high thermal resistance. The dielectric means, or polyimide layer 228, is preferably formed from a plastic dielectric material, such as Kapton. It is even more preferred that this dielectric layer 228 have dispersed throughout a suitable dielectric material having relatively high thermal conductivity, such as alumina, aluminum nitride or beryllium oxide. The thermally conductive adhesive layer 230 used to attach the dielectric layer 228 to the heat sink 214, is preferably formed from an epoxy paste having silver or other appropriate thermally conductive medium dispersed throughout. This medium may also be electrically conductive since the dielectric isolation is provided by layer 228. The silver filled epoxy layer 230 is used for its convenience and availability, however other materials such as the commercially available B-staged epoxies which are partially cured pastes, may also be used.

As shown in FIG. 3, a layer 226 of solder or other attachment means is required between the interface device 210 and dielectric layer 228. It is preferred that this solder layer 226 be formed from a 60/40 tin-lead solder. This is preferred because the solder layer 220 used to attach the integrated circuit 212 to the interface device 210 is a 25/75 lead-tin solder and this combination of solders having differing reflow temperatures permits ease of manufacturability without detrimental effects to the complete structure. In addition, a flash layer (not shown) of metallization may be required on the dielectric layer 228 to promote adhesion between the dielectric layer 228 and the solder layer 226, as well as between the dielectric layer 228 and the thermally conductive adhesive layer 230. The structure shown in FIG. 3 provides dielectric isolation when necessary between an integrated circuit chip 212 and heat sink 214.

The coefficient of thermal expansion of the preferred interface device should be no more than about $10 \times 10^{-6}/°C$. This is the maximum expansion rate that is desirable. The coefficient of thermal expansion for the silicon integrated circuit chip is approximately equal to about $3.5 \times 10^{-6}/°C$., while the coefficient for an aluminum heat sink is approximately $24 \times 10^{-6}/°C$. In addition, the coefficients for copper and an iron-nickel alloy characterized by approximately 42 percent nickel are $17.7 \times 10^{-6}/°C$. and about $2.7 \times 10^{-6}/°C$., respectively.

An empirically derived equation to determine the average coefficient of thermal expansion (CTE) of the interface device is:

Average *CTE* of interface device =

$$.62 \times \% \text{ Copper} \times CTE \text{ of Copper} +$$
$$\% \text{ low expansion material } (LEM) \times CTE \text{ of } LEM$$

where 0.62 is the Young's Modulus of elasticity of copper to that of an iron-nickel alloy having approximately 42 percent nickel.

An interface device having a cross-sectional area which is approximately 80 percent copper and approximately 20 percent an iron-nickel alloy characterized by about 42 percent nickel, such as either device 10, 110 or 210 shown in FIGS. 1, 2 and 3, was found to be approximately $9 \times 10^{-6}/°$ C. This coefficient of thermal expansion is sufficiently compatible with that of silicon to allow the solder joint 20, 120 or 220 between the chip 12, 112 or 212 and the interface device 10, 110 or 210 to remain intact during operation without fracturing for a substantial number of temperature cycles between $-40°$ C. and $+125°$ C.

Figure 4:
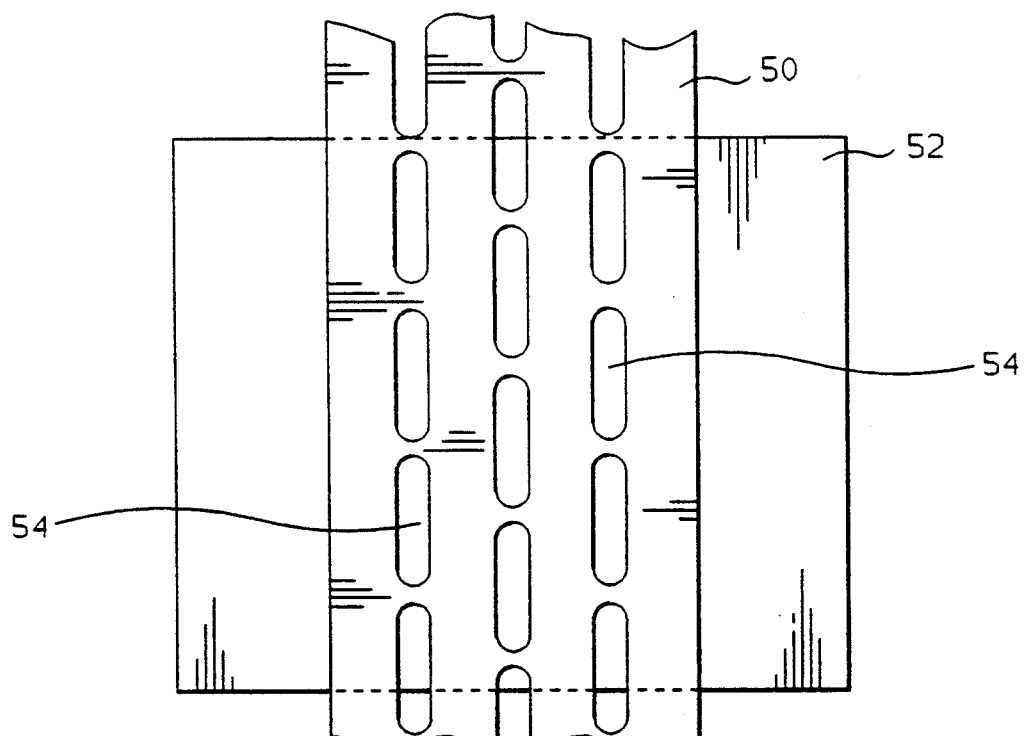
FIG. 4 is a plan view of the perforate layer of material characterized by a low coefficient of thermal expansion overlaying a layer of material characterized by high thermal conductivity.
Figure 5:
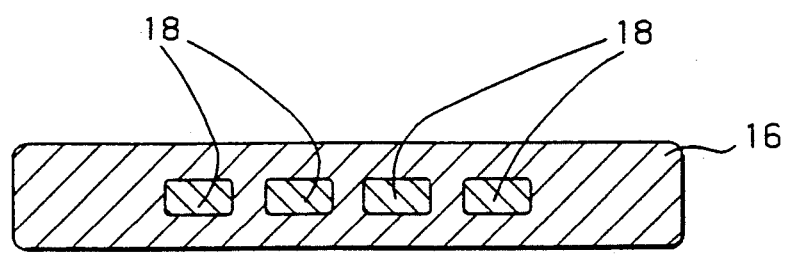
FIG. 5 is a cross sectional view of the interface device shown in FIG. 1.

There are several methods proposed for forming this interface device. A first method comprises the steps of sandwiching a perforate layer of low expansion material between two outer layers of copper and appropriately heating the materials so as to metallurgically bond the materials together The perforate layer of low expansion material may be formed by punching, piercing, dissolution or any other suitable means. In addition, the perforate layer 50, as shown in FIG. 4 overlaying a single layer 52 of copper or other appropriate high thermal conductivity material, is preferably provided only in the center region of the sandwiched layers (only the bottom layer 52 is shown for clarity), so as to correspond to the region where the integrated circuit chip will be disposed. During the heating step, the copper flows into the perforate areas 54 of the low expansion material 50, thereby completely enveloping the low expansion material 50. The resulting material is then sliced appropriately through all three sandwiched layers such that a resulting cross section through the device is illustrated in FIG. 5. FIG. 5 shows the interface device 10 illustrated in FIG. 1 which comprises a plurality of low expansion second material regions 18 which were formed from the perforate layer (50 in FIG. 4), surrounded by the high thermal conductivity material 16 which flowed into the perforations during heat treatment.

Alternatively, the device having a cross section as shown in FIGS. 2 or 3 may be formed by sandwiching a plurality of perforate layers between alternating layers of copper. Theoretically, the device could have a multitude of these layers, the only limit being manufacturability and feasibility. However, a device having two perforate layers sandwiched between three alternating layers of copper is preferred.

As another alternative, the device could be fabricated by sandwiching strips of low expansion wire between alternating layers of copper, and subsequently heat treating to metallurgically bond the materials. Again this would produce the desired result wherein the high conductivity copper completely surrounds a plurality of regions containing the low expansion material. Although this alternative embodiment performs satisfactorily, it is not as preferred as the perforated embodiment which provides better control of the coefficient of thermal expansion properties of the device in both lateral directions, i.e., the x and y-axis of the device.

This invention readily provides an interface device which promotes efficient heat transfer between a heat generating integrated circuit chip and a heat sink, while also providing an intermediate and compatible coefficient of thermal expansion between the two components. While our invention has been described in terms of preferred embodiments, it is apparent that other forms of the device could be adopted by one skilled in the art, such as by substituting materials, or components. Accordingly the scope of our invention is to be limited only by the following claims.

The embodiments of the invention in which an exclusive property or privilege is claimed are defined as follows:

1. An interface device for thermally coupling an integrated circuit chip to a heat sink, the interface device comprising:
   a layer of copper;
   a plurality of regions comprising an iron-nickel alloy characterized by a low coefficient of thermal expansion, each of said plurality of regions are completely enveloped by said copper, and are disposed laterally with respect to each other and generally under the integrated circuit chip between the integrated circuit chip and heat sink, such that said copper is provided continuously between the integrated circuit and the heat sink; and
   said interface device having an effective coefficient of thermal expansion intermediate between that of said copper and said iron-nickel alloy and characterized by a thermal conductivity similar to the thermal conductivity of said copper.

2. An interface device as recited in claim 1 wherein said iron-nickel alloy comprises approximately 42 percent nickel and approximately 58 percent iron.

3. An interface device as recited in claim 1 wherein there are two regions comprising said iron-nickel alloy generally disposed laterally with respect to each other and between the integrated circuit and the heat sink.

4. The combination comprising:
   a silicon, monolithic integrated circuit chip;
   an interface comprising a layer of copper which completely surrounds a plurality of regions characterized by a low coefficient of thermal expansion which are disposed laterally with respect to each other;
   and an aluminum heat sink, such that said layer of copper is provided continuously between said integrated circuit chip and said heat sink and said plurality of regions are disposed generally under said integrated circuit chip within said copper layer.

5. An interface device for thermally coupling an integrated circuit chip having a first coefficient of thermal expansion to a heat sink having a second coefficient of thermal expansion, said interface device characterized by:
   a first material which has high thermal conductivity and which contacts both said integrated circuit and said heat sink, and a plurality of regions of a second material which have a low coefficient of thermal expansion, said plurality of regions being disposed throughout said first material generally under said integrated circuit chip;
   wherein the improvement comprises said first material being provided continuously in at least one region between said integrated circuit chip and said heat sink, such that said interface device has an effective coefficient of thermal expansion intermediate between the first and second coefficients of thermal expansion and characterized by a thermal conductivity similar to the thermal conductivity of said first material.

6. The combination comprising:

a silicon monolithic integrated circuit chip;

an interface device comprising a layer of copper which completely surrounds a plurality of regions characterized by a low coefficient of thermal expansion;

an aluminum heat sink; and a dielectric layer substantially consisting of a polyimide having dispersed throughout a thermally conductive material, and appropriate adhesive means for attaching said dielectric layer to said interface device and said aluminum heat sink.

* * * * *